United States Patent
Takezawa

(10) Patent No.: US 8,665,303 B2
(45) Date of Patent: Mar. 4, 2014

(54) IMAGE FORMING APPARATUS PROVIDED WITH LASER DRIVE APPARATUS FOR CONTROLLING LIGHT AMOUNT OF LASER BEAM SCANNED BY SCANNING UNIT

(71) Applicant: Canon Kabushiki Kaisha, Tokyo (JP)

(72) Inventor: Satoru Takezawa, Abiko (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/867,706

(22) Filed: Apr. 22, 2013

(65) Prior Publication Data

US 2013/0293661 A1    Nov. 7, 2013

(30) Foreign Application Priority Data

May 7, 2012    (JP) ................................. 2012-106310

(51) Int. Cl.
*B41J 2/435*    (2006.01)
(52) U.S. Cl.
USPC .......................................... 347/236; 347/246
(58) Field of Classification Search
USPC ................... 347/236, 237, 246, 247
See application file for complete search history.

(56) References Cited

U.S. PATENT DOCUMENTS

| 6,114,682 | A | * | 9/2000 | Minakuchi et al. | ............ 250/205 |
| 2012/0188323 | A1 | * | 7/2012 | Nito | .............................. 347/118 |

FOREIGN PATENT DOCUMENTS

JP    2002-040350    2/2002

* cited by examiner

*Primary Examiner* — Hai C Pham
(74) *Attorney, Agent, or Firm* — Fitzpatrick, Cella, Harper & Scinto

(57) ABSTRACT

First and second light amount detection elements are arranged on a scanning line of a laser beam. The first light amount detection element receives a laser beam having a first light amount, and the second light amount detection element receives a laser beam having a second light amount that is lower than the first light amount. The detection signal that is output by the second light amount detection element is amplified by an amplifier and used as a synchronization signal. Here, an amplification factor of this amplifier is greater than an amplification factor of another amplifier for amplifying the detection signal that is output by the first light amount detection element. The detection signals amplified by the amplifiers are modified by a modification coefficient that correspond to the amplification factors, and used as signals that indicate the light amounts.

15 Claims, 7 Drawing Sheets

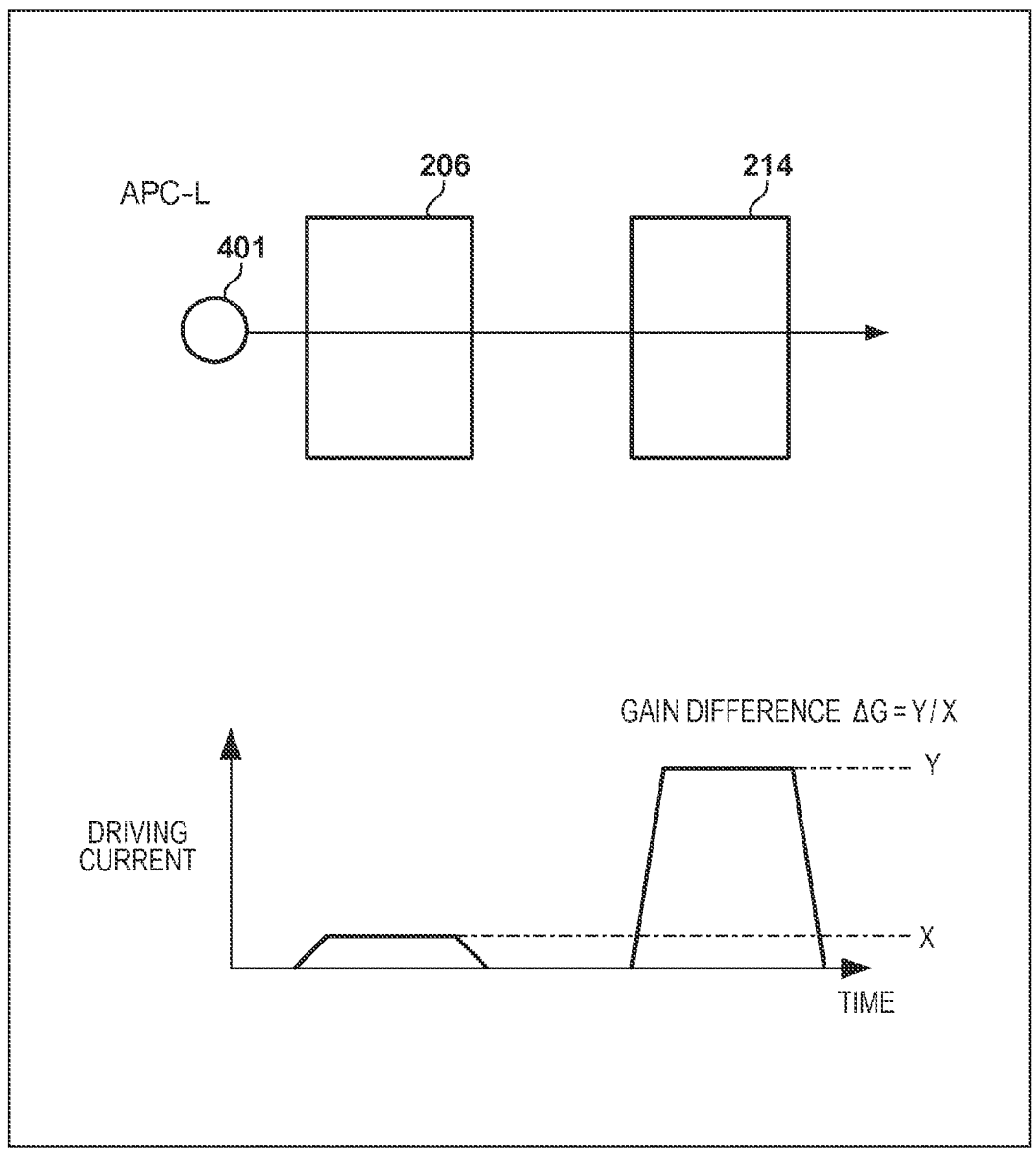

IMAGE FORMING APPARATUS PROVIDED WITH LASER DRIVE APPARATUS FOR CONTROLLING LIGHT AMOUNT OF LASER BEAM SCANNED BY SCANNING UNIT

BACKGROUND OF THE INVENTION

1. Field of the Invention

The present invention relates to a laser drive apparatus and an image forming apparatus.

2. Description of the Related Art

In electrophotographic-type image forming apparatuses, an edge emitting laser (EEL) and a surface emitting laser (SEL) are often adopted as light sources. In particular, a vertical cavity surface emitting laser (VCSEL), which is one type of surface emitting lasers (SEL), draws attention. In a VCSEL, a plurality of light-emitting points can be provided on a semiconductor substrate, so that an electrostatic latent image can be effectively formed by using a plurality of laser beams.

Meanwhile, the light amount of a laser beam that is emitted from a semiconductor laser varies depending on the temperature of the semiconductor laser. This may cause density unevenness in an image or the like. Therefore, automatic light amount control (APC) for maintaining constant a light amount of the laser beam is performed (Japanese Patent Laid-Open No. 2002-40350). With APC, a driving current is set that enables the semiconductor laser to emit a laser beam of a constant light amount.

Meanwhile, laser light-emitting elements have the property of emitting light only upon receiving a driving current of at least a certain threshold Th. In other words, a laser light-emitting element does not emit light if an electric current of less than the threshold Th is supplied. In order for the laser light-emitting element to emit pulse light without delay of turn on, it is necessary to constantly supply the laser light-emitting element with a bias current of approximately the threshold Th. However, since this threshold Th as well is temperature dependent, it is also necessary to obtain the threshold Th when performing the APC.

The threshold Th can be obtained as an x intercept of a function f(x) that expresses light amount (y axis) as a function of driving current (x axis). Assuming that this function is a linear function, this function can be determined if two coordinates (I_Pa, Pa) and (I_Pb, Pb) are known. Here, Pa and Pb each denotes a light amount (Pa>Pb). Ordinarily, Pb is a fraction of Pa. Also, I_Pa and I_Pb are the driving currents that correspond to Pa and Pb. I_Pa and I_Pb can be obtained by performing APC with respect to the light amounts Pa and Pb. From (I_Pa, Pa) and (I_Pb, Pb), the threshold Th is obtained and then a bias current is determined. The bias current is ordinarily set to a current that is approximately 90% of the threshold Th.

Meanwhile, in order to correctly obtain a threshold Th, it is required that Pb, which is the relatively lower light amount between Pa and Pb, have a value as small as possible. This is because if Pb is high, an approximation error of the function may become large. This tendency is likely to be noticeable if the temperature of the laser light-emitting element increases. On the other hand, if the light amount Pb is too low, so-called synchronous detection for acquiring a scanning timing of the laser beam cannot be performed.

SUMMARY OF THE INVENTION

Therefore, the present invention has a feature of being capable of performing synchronous detection even if a light amount for obtaining a threshold of a laser light-emitting element is low, and of determining the threshold and a bias current of the laser light-emitting element with high accuracy.

An embodiment of the present invention provides a laser drive apparatus for controlling a light amount of a laser beam scanned by a scanning unit, comprising the following elements. A first light amount detection unit is configured to receive a laser beam that is output from a laser light-emitting element and to output a first detection signal that indicates a light amount of the laser beam. A second light amount detection unit is arranged side by side with the first light amount detection unit in a scanning direction of the laser beam, and is configured to receive the laser beam output from the laser light-emitting element and to output a second detection signal that indicates the light amount of the laser beam. An amplification unit is configured to amplify the second detection signal that is output by the second light amount detection unit. A binarization unit is configured to binarize the second detection signal amplified by the amplification unit and to output the binarized second detection signal as a synchronization signal. A modification unit is configured to subject the second detection signal amplified by the amplification unit to analog/digital conversion, and to modify the converted second detection signal with a modification coefficient that corresponds to an amplification factor of the amplification unit. A light amount adjustment unit is configured to obtain a first driving current that flows through the laser light-emitting element when the light amount indicated by the first detection signal that is output by the first light amount detection unit reaches a first target light amount, and a second driving current that flows through the laser light-emitting element when the light amount indicated by the second detection signal that is output by the modification unit reaches a second target light amount that is lower than the first target light amount. A determination unit is configured to determine a driving current that serves as a threshold at which the laser light-emitting element starts to emit light, on the basis of the first target light amount, the first driving current, the second target light amount, and the second driving current.

Further features of the present invention will become apparent from the following description of exemplary embodiments (with reference to the attached drawings).

BRIEF DESCRIPTION OF THE DRAWINGS

FIG. 6 is a diagram illustrating an initial mode.

DESCRIPTION OF THE EMBODIMENTS

Figure 1:
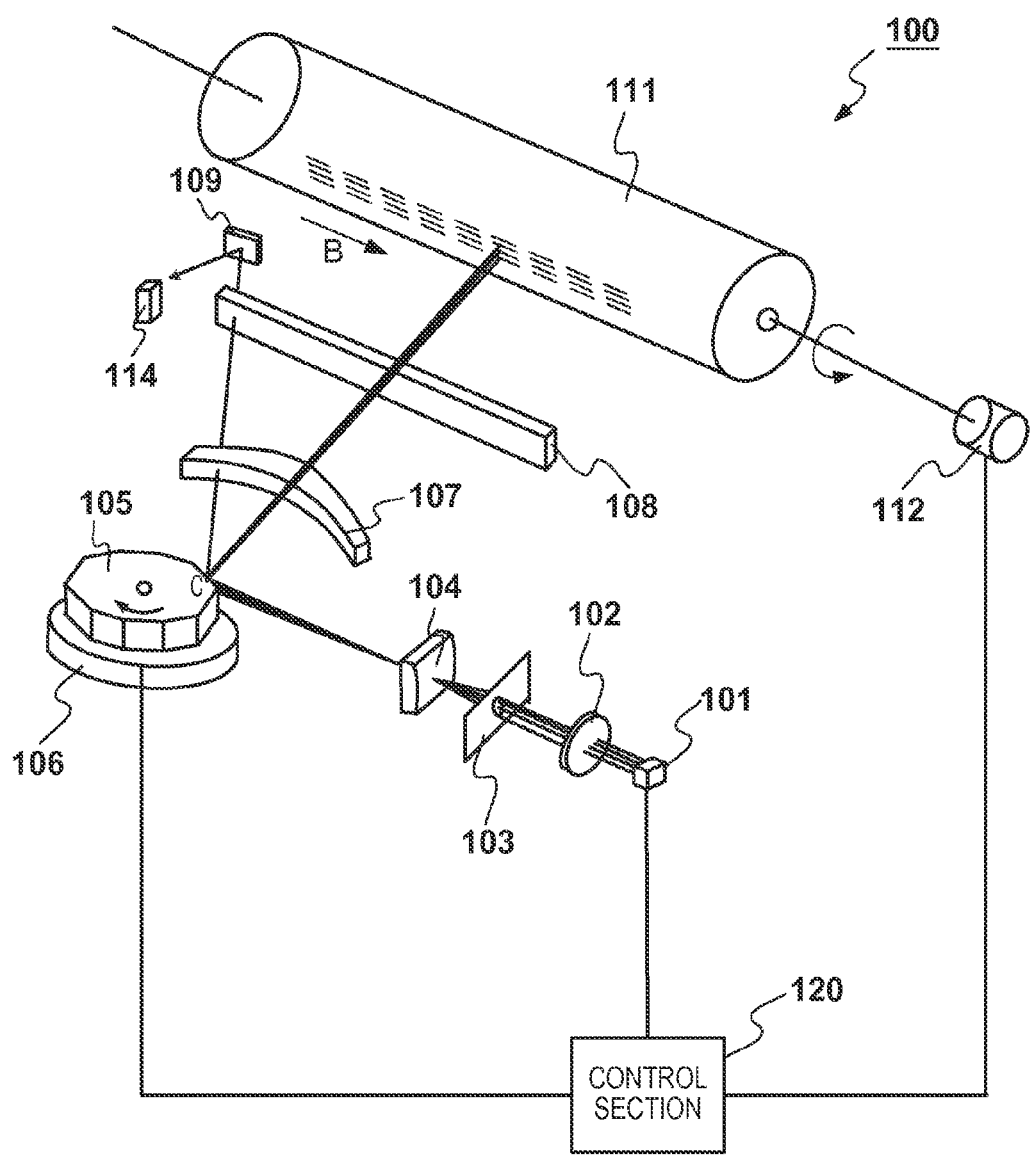
FIG. 1 is a diagram schematically illustrating a light scanning apparatus.

FIG. 1 is a diagram schematically illustrating a configuration of a light scanning apparatus 100 for use in an image forming apparatus according to an embodiment of the present invention. A laser light-emitting element 101 is, for example, a VCSEL. In the case of an edge emitting laser (EEL), a laser beam can be emitted in two directions, that is, a frontward direction and a rearward direction, so that it is possible to perform APC with the use of the rearward light. However, in the case of a VCSEL, it is impossible due to its structure to acquire rearward light. Therefore, in the VCSEL, a laser beam that exits in the front direction is detected and APC is performed. Note, however, that the VCSEL has the advantage that a plurality of main scanning lines are formed in one main scan. Since the plurality of main scanning lines can be formed in one main scan, the VCSEL has the advantage that the number of rotation of a rotating polygon mirror 105 can be reduced. Alternatively, it is also possible to form an image at a high speed without reducing the number of rotations.

A collimating lens 102 is an optical member for converting light beams that are emitted from the laser light-emitting element 101 into parallel light beams. An aperture stop 103 is a member for limiting the size of the parallel light beams that pass therethrough to a predetermined size. A cylindrical lens 104 has a given refracting power only in a sub scanning direction, and serves as an optical member for imaging the parallel light beams that have passed through the aperture stop 103, as a line image, on a reflecting surface of the rotating polygon mirror 105 in a main scanning direction. Note here that "main scanning direction" refers to a direction in which a laser beam moves. "Sub scanning direction" refers to a direction that is orthogonal to the main scanning direction. The rotating polygon mirror 105 is driven by a scanner motor 106, and rotates at a constant speed in a direction of an arrow C in FIG. 1, thereby subjecting the laser beam imaged on the reflecting surface to deflection scanning. Thus, the rotating polygon mirror 105 serves as a scanning unit for scanning the laser beam output by the laser light-emitting element 101. Instead of the rotating polygon mirror 105, a deflection device such as a galvanometer mirror may be employed. A toric lens 107 is an optical element that has an fθ characteristic and has different refractive indices in the main scanning direction and in the sub scanning direction. A diffractive optical element 108 is an optical element that has an fθ characteristic, and serves as an elongated diffraction section that has different powers in the main scanning direction and in the sub scanning direction. A light amount sensor 114 is disposed outside an image region in a scanning range of the laser beam, and detects a laser beam that is reflected by a reflection mirror 109. The scanning range of the laser beam is divided into an image region that forms an electrostatic latent image on a photo conductor drum 111, and a non-image region that does not form an electrostatic latent image on the photo conductor drum 111. The photo conductor drum 111 is a photo conductor (image carrier) on which the electrostatic latent image is formed by the laser beam scanned by the rotating polygon mirror 105. By the main scanning performed by the rotating polygon mirror 105, the spot of the laser beam emitted from the laser light-emitting element 101 moves linearly along an axial direction of the photo conductor drum 111. That is, the spot of the laser beam moves in a direction of an arrow B in FIG. 1. By the photo conductor drum 111 being driven and rotated by a drive section 112 in a direction of an arrow A, sub scanning of the laser beam is realized. A control section 120 is a control unit for controlling the drive section 112, the laser light-emitting element 101, and the scanner motor 106. For example, the control section 120 serves as a control unit for controlling a timing of emitting the laser beam in sync with a synchronization signal that is output by the light amount sensor 114. Note that the image forming apparatus includes, in addition to the light scanning apparatus 100 provided with the laser drive apparatus of the present invention, a developing device for developing the electrostatic latent image into a toner image, a transcriber for transcribing the toner image on a paper, a fixing device for fixing an unfixed toner image to the paper, and the like.

Embodiment 1

Control Configuration

Figure 2:
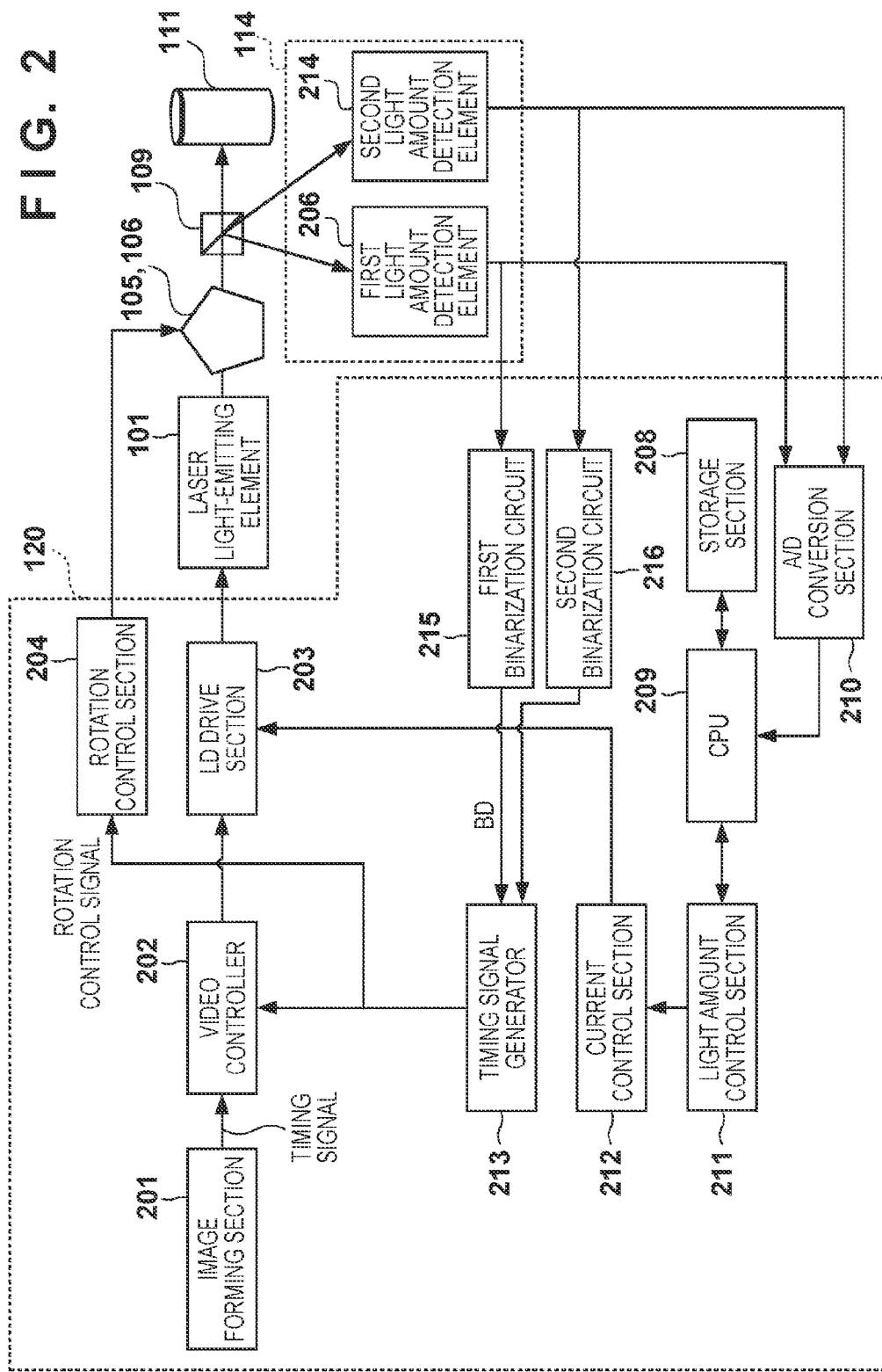
FIG. 2 is a diagram schematically illustrating a control section.

The control section 120 that serves as a laser drive apparatus will be described, with reference to FIG. 2. An image forming section 201 subjects image data received from a scanner device or a host computer to image processing, generates image data for printing, and outputs the generated image data to a video controller 202. The video controller 202 outputs the image data to an LD drive section 203 in accordance with a main scanning timing and a sub scanning timing that are instructed by a timing signal generator 213. "LD" is an abbreviation of "laser diode" or "laser device". The timing signal generator 213 generates timing signals that indicate the main scanning timing and the sub scanning timing using, as a standard, synchronization signals BD that are output from a first binarization circuit 215 and a second binarization circuit 216. The LD drive section 203 modulates with the image data a driving current that is set by a current control section 212, and outputs the modulated driving current to the laser light-emitting element 101. Accordingly, the laser light-emitting element 101 outputs a laser beam for a lighting time that depends on an image tone. A light amount control section 211 is controlled by a CPU 209, performs an automatic light amount control (APC), adjusts a target light amount of the laser beam, and sets the target light amount in the current control section 212. The current control section 212 determines a driving current of the LD drive section 203 for driving the laser light-emitting element 101 based on the target light amount, and sets the driving current to the LD drive section 203. The driving current corresponds to the target light amount. Note that the entire functionality of the light amount control section 211 may be realized by the CPU 209. Therefore, the CPU 209 and the light amount control section 211 may share functionalities as suitable. A rotation control section 204 controls the scanner motor 106 based on a timing signal (rotation control signal) output from the timing signal generator 213 so that the rotating polygon mirror 105 including a plurality of mirrors rotates at a certain speed and the rotation of the rotating polygon mirror 105 is synchronized with the image data (video signal) output from the video controller 202. The laser beam that is output from the laser light-emitting element 101 is deflected by the reflecting surface of the rotating polygon mirror 105, so as to be scanned on an image forming surface of the photo conductor drum 111. The laser beam emitted from the laser light-emitting element 101 is present as the laser beam scanned by the rotating polygon mirror 105, is deflected by the reflection mirror 109, and is incident on a first light amount detection element 206 and a second light amount detection element 214 included in the light amount sensor 114. The first light amount detection element 206 and the second light amount detection element 214 are light receiving elements such as photo diodes. Note here that the first light amount detection element 206 and the second light amount detection element 214 have amplifiers that have different amplification factors (gain). The first light amount detection element 206 and the second light amount detection element 214 each output an electric current that corresponds to a light amount of the received laser beam. This electric current is converted into a voltage by a resistance. This voltage is a detection signal that indicates the light amount. Note that since this detection signal indicates a light amount, this detection signal itself is also referred to simply as "light amount". The detection signal that is output by the first light amount detection element 206 is compared with a reference level and binarized in the first binarization circuit 215, thereby being output as a BD signal. Similarly, the detection signal that is output by the second light amount detection element 214 is compared with a reference level and binarized in the second binarization circuit 216, thereby being output as a BD signal. Further, the detection signals output by the first light amount detection element 206 and the second light amount detection element 214 are subjected to analog/digital conversion in an A/D conversion section 210 so as to be converted into a detection signal (light amount data), and are then input into the CPU 209 and the light amount control section 211. The CPU 209 stores the light amount data in a storage section 208. Thus, the first light amount detection element 206 serves as a first light amount detection unit for receiving a laser beam that is output from a laser light-emitting element and for outputting a first detection signal indicating a light amount of the laser beam. Also, the second light amount detection element 214 is arranged side by side with the first light amount detection unit in a scanning direction of the laser beam, and serves as a second light amount detection unit for receiving the laser beam output from the laser light-emitting element and for outputting a second detection signal indicating the light amount of the laser beam.

APC and Light Amount Detection Method

Figure 3:
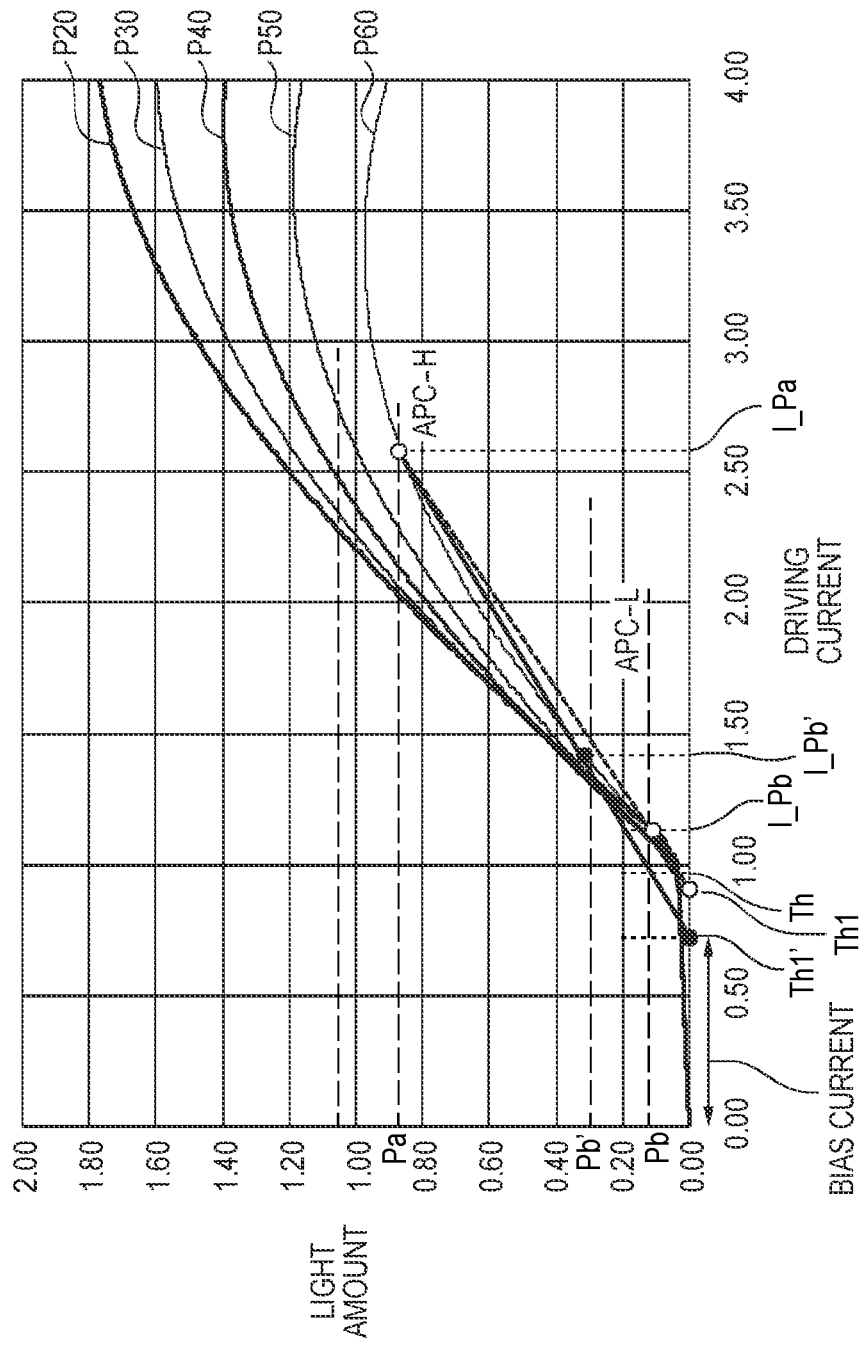
FIG. 3 is a diagram illustrating how to obtain I-L characteristics and thresholds.

In FIG. 3, the lateral axis denotes driving currents and the vertical axis denotes light amounts of a laser beam. P20 to P60 denote light amounts as functions of driving currents when the temperature of the laser light-emitting element 101 is 20° C. to 60° C. A threshold Th1, which is a driving current with which the laser light-emitting element 101 starts to emit light, can be obtained as an x intercept of a function f(x) that represents light amount (y axis) as a function of driving current (x axis). Assuming that this function f(x) is a linear function, this function f(x) can be determined if two coordinates (I_Pa, Pa) and (I_Pb, Pb) are known. Here, Pa and Pb each denotes a light amount (Pa>Pb). I_Pa and I_Pb denote driving currents that correspond to Pa and Pb. I_Pa and I_Pb can be obtained by performing APC with respect to the light amounts Pa and Pb. The threshold Th1 is obtained from (I_Pa, Pa) and (I_Pb, Pb), and a bias current is further determined. Ordinarily, the bias current is set to a current that is approximately 90% of a threshold Th. Note that, since the light amount Pa is greater than the light amount Pb, the APC with respect to the light amount Pa is referred to as APC-H, and the APC with respect to the light amount Pb is referred to as APC-L.

As illustrated in FIG. 3, it is clear that the actual threshold Th is slightly shifted from the threshold Th1 obtained by the approximate calculation. Particularly, as shown by P60, the higher the temperature of the laser light-emitting element 101 becomes, the greater the difference between the actual threshold and the threshold Th1. However, if the light amount Pb could be set lower, the error between the threshold Th and the threshold Th1 would be reduced. On the other hand, if the light amount Pb is set too low, no timing signal (synchronization signal) can be obtained. Therefore, it is desired that the synchronization signal can be obtained, and the light amount Pb can be set as low as possible.

In view of this circumstance, according to the present embodiment, this problem is solved by improving the configuration of a circuit that is assigned to the APC-L. Specifically, a detection signal that indicates the light amount Pb is amplified and the amplified detection signal is used as a synchronization signal. With this measure, the synchronous detection can be performed even if the light amount Pb for obtaining the threshold Th of the laser light-emitting element 101 is set low. Also, since the light amount Pb for obtaining the threshold Th of the laser light-emitting element 101 can be set low, it is possible to determine the threshold Th and the bias current of the laser light-emitting element 101 with high accuracy.

Figure 4:
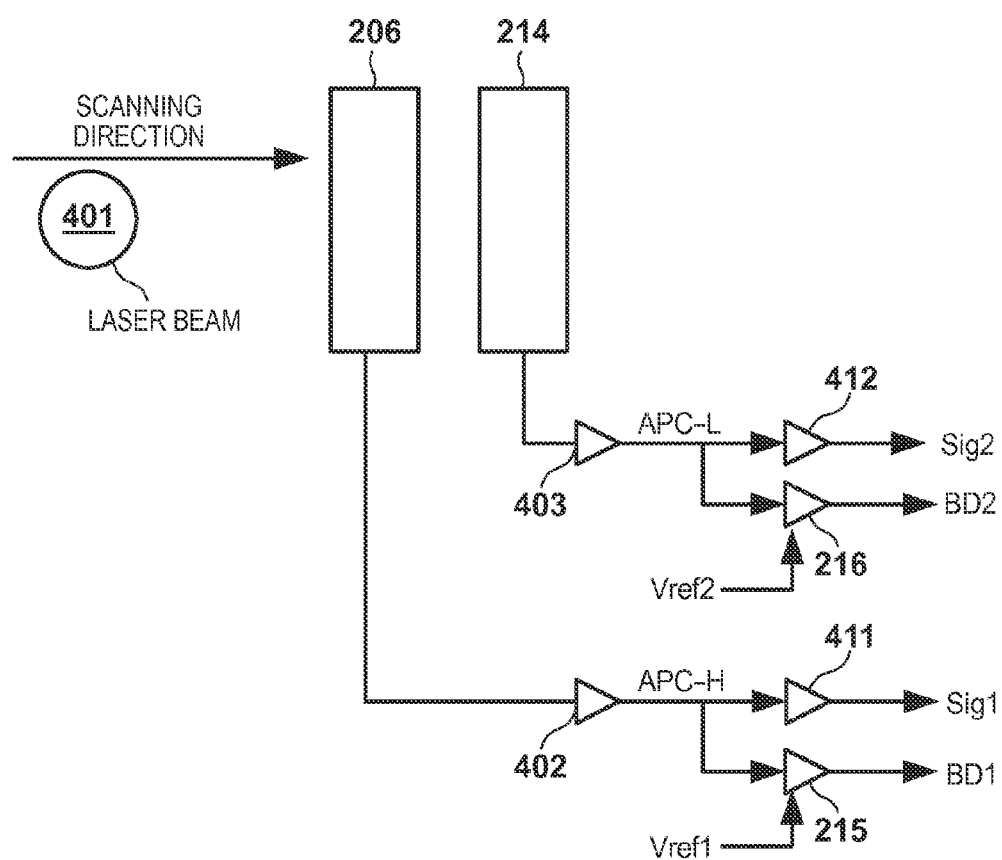
FIG. 4 is a diagram illustrating details of light amount detection elements.

The light amount detection method will be described, with reference to FIG. 4. As illustrated in FIG. 4, the first light amount detection element 206 and the second light amount detection element 214 are arranged on a scanning line of the laser beam 401. Although, in FIG. 4, the first light amount detection element 206 and the second light amount detection element 214 are arranged with a predetermined space therebetween, they may be arranged adjacent to each other.

The detection signal that is output by the first light amount detection element 206 is amplified by an amplifier 402 in which a predetermined amplification factor G1 is set, and is output to the first binarization circuit 215 and an A/D converter 411 of the A/D conversion section 210. The amplifier 402 is an example of a first amplification unit for amplifying the first detection signal that is output by the first light amount detection unit. When performing the APC, these components are assigned to the light amount Pa. The first binarization circuit 215 binarizes the detection signal by comparing it with a reference voltage Vref1, and outputs a synchronization signal BD1. The first binarization circuit 215 serves as a first binarization unit for binarizing the first detection signal amplified by the first amplification unit and outputting the binarized first detection signal as a synchronization signal. Also, the A/D converter 411 converts the detection signal into light amount data (detection signal Sig1) that constitutes a digital value. The A/D converter 411 is an example of a first analog/digital conversion unit that subjects the first detection signal amplified by the first amplification unit to the analog/digital conversion, and outputs a first light amount that corresponds to the first detection signal.

On the other hand, the detection signal that is output by the second light amount detection element 214 is amplified by an amplifier 403 in which a predetermined amplification factor G2 is set, and is output to the second binarization circuit 216 and an A/D converter 412 of the A/D conversion section 210. The amplifier 403 is an example of a second amplification unit for amplifying the second detection signal that is output by the second light amount detection unit. When performing the APC, these components are assigned to the light amount Pb. The second binarization circuit 216 binarizes the detection signal by comparing it with a reference voltage Vref2, and outputs a synchronization signal BD2. The second binarization circuit 216 is an example of a second binarization unit that binarizes the second detection signal amplified by the second amplification unit, and outputs the binarized second detection signal as a synchronization signal. Also, the A/D converter 412 converts the detection signal into light amount data (detection signal Sig2) that constitutes a digital value. The A/D converter 412 is an example of a second analog/digital conversion unit that subjects the second detection signal amplified by the second amplification unit to the analog/digital conversion, and outputs a second light amount that corresponds to the second detection signal.

Here, the amplification factor G2 with respect to the APC-L is set to be higher than the amplification factor G1 with respect to the APC-H. For example, if the amplification factor G1 is 10 times, the amplification factor G2 is then set to be 30 times. In this case, a magnification of the amplification factor G2 with respect to the amplification factor G1 is 3 times. Note that it is possible to obtain, through experimentation or simulation, a magnification such that the light amount Pb for obtaining the threshold Th of the laser light-emitting element 101 can be set low and the synchronous detection can also be performed.

In the present embodiment, a reduction in an APC implementation time period is achieved by performing APC with respect to both light amounts Pa and Pb in one scan. In order to realize the reduction, two light amount detection elements are needed. Further, the target light amount of the laser light-emitting element 101 is set to Pa when the laser beam 401 is incident on the first light amount detection element 206, and set to Pb when the laser beam 401 is incident on the second light amount detection element 214.

Locations of the spots of the laser beam 401, and levels of the driving current and the detection signal will be described, with reference to FIGS. 5A to 5D. According to FIG. 5A, a light receiving section of the light amount detection element has a width W2 that is wider than a spot diameter W1 of the laser beam 401. Also, in FIG. 5A, locations of the laser beam 401 are shown at respective times T1 to T3. The direction in which the laser beam 401 is scanned is shown in a dashed line arrow.

Figure 5A:
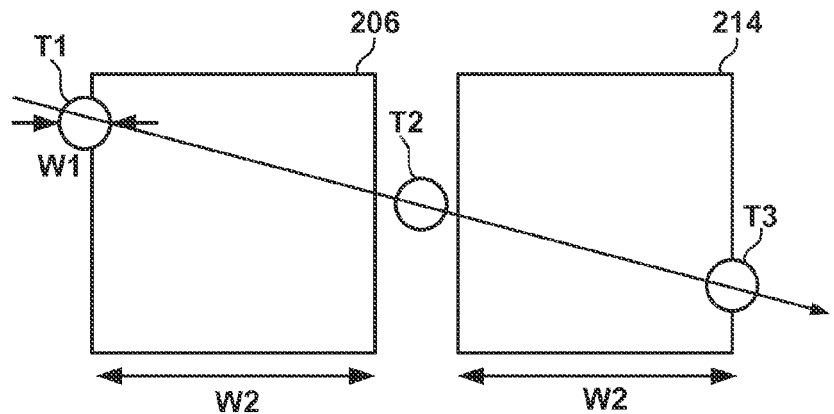
FIGS. 5A, 5B, 5C, and 5D are diagrams illustrating arrangement of the light amount detection elements, and relationships between a driving current and detection signals.
Figure 5B:
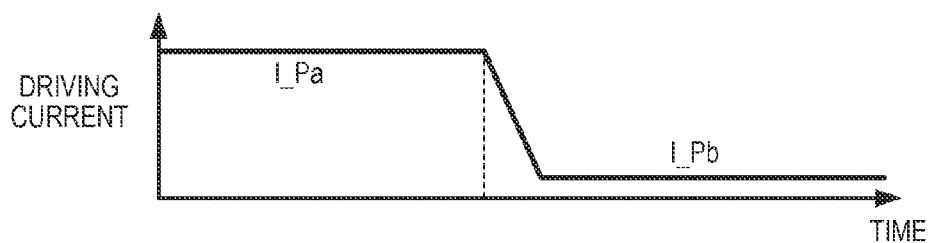

The CPU 209 sets a target light amount of the laser beam to Pa in order to perform the APC-H at time T1. When time T2 comes, the laser beam 401 is located between the first light amount detection element 206 and the second light amount detection element 214. The CPU 209 shifts, at this timing, from the APC-H to the APC-L, and sets the target light amount to Pb. FIG. 5B shows change of driving current when the CPU 209 shifts from the APC-H to the APC-L.

Figure 5C:
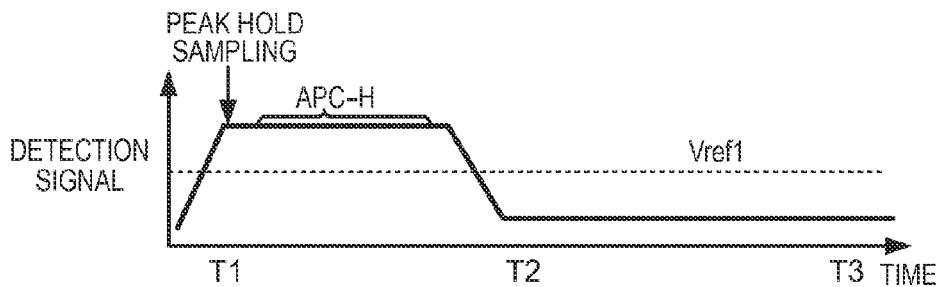
Figure 5D:
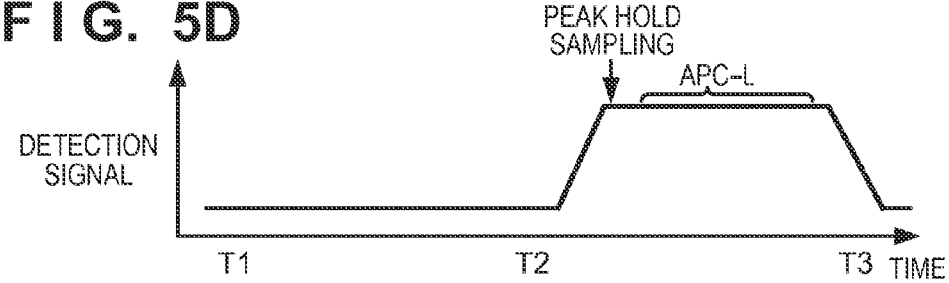

FIG. 5C shows the detection signal that is output by the first light amount detection element 206, and FIG. 5D shows the detection signal that is output by the second light amount detection element 214. As shown in FIG. 5C, the target light amount is switched at a timing at which the level of the synchronization signal BD1 output by the first binarization circuit 215 shifts from Hi to Low. The CPU 209 recognizes the timing at which the level of the synchronization signal BD1 shifts from Hi to Low as a timing at which the laser beam moves from the first light amount detection element 206 to the second light amount detection element 214. That is, this timing is a timing at which the light amount shown by the first detection signal that is output by the first light amount detection element 206 changes, after having reached a peak, to a value that is less than a predetermined reference value. This timing is hereinafter referred to as "switching timing". This switching timing means a timing at which neither the first light amount detection element 206 nor the second light amount detection element 214 detects the laser beam. The CPU 209 serves as a change unit for changing, when recognized this timing, a driving current of the laser light-emitting element from a driving current for obtaining a first target light amount to a driving current for obtaining a second target light amount. When the laser beam is incident on the second light amount detection element 214, the CPU 209 starts the APC-L. As shown in FIG. 5D, due to the laser beam being incident on the second light amount detection element 214, the level of the detection signal that is output by the second light amount detection element 214 increases.

The APC will further be described in detail. When having started the APC-H, the CPU 209 sets the light amount Pa in the light amount control section 211. The light amount control section 211 sets the current value I_Pa for obtaining the light amount Pa in the current control section 212. With this measure, the laser light-emitting element 101 starts to emit light. When the laser beam starts to be incident on the light receiving section of the first light amount detection element 206, the level of the detection signal starts to gradually increase. When the incidence of the laser beam on the light receiving section of the first light amount detection element 206 is entirely completed, the level of the detection signal reaches a peak. When the detection signal exceeds the reference voltage Vref1, the synchronization signal BD1 becomes Hi and is used for the synchronous detection. On the other hand, the detection signal is held at the peak, and sampled in the A/D converter 411. If the level of the detection signal does not increase even when a predetermined time period has elapsed since the level of the detection signal has exceeded the reference voltage Vref1, the CPU 209 determines that the incidence of the laser beam on the light receiving section of the first light amount detection element 206 is entirely completed, and starts the APC-H. The CPU 209 will end the APC-H by the time the laser beam exits from the light receiving section of the first light amount detection element 206. That is, the CPU 209 performs fine adjustment of the driving current until the light amount shown by the detection signal Sig1 matches the target light amount Pa. Thus, the CPU 209 serves as a light amount adjustment unit for obtaining a first driving current that flows through the laser light-emitting element when the first light amount reaches the first target light amount.

On the other hand, when the laser beam starts to exit from the light receiving section of the first light amount detection element 206, the level of the detection signal that is output by the first light amount detection element 206 starts to decrease. Accordingly, the level of the synchronization signal that is output by the first binarization circuit 215 changes from Hi to Low. The CPU 209 starts the APC-L when having recognized that the level of the synchronization signal that is output by the first binarization circuit 215 has changed from the Hi to Low. From the relationship obtained in the previous APC between the light amount and the driving current with which the light amount Pb can be obtained, the CPU 209 obtains the driving current I_Pb that corresponds to the light amount Pb, and sets the obtained driving current in the current control section 212 through the light amount control section 211. In this way, it is possible in the present embodiment to change the target light amount at an appropriate timing by observing the level of the synchronization signal that is output by the first binarization circuit 215.

When the laser beam is incident on the light receiving section of the second light amount detection element 214, as shown in FIG. 5D, the level of the detection signal that is output by the second light amount detection element 214 starts to gradually increase. Further, when the incidence of the laser beam on the light receiving section of the second light amount detection element 214 is entirely completed, the level of the detection signal reaches a peak. The light amount of the laser beam when it is incident on the second light amount detection element 214 is relatively low, since the target light amount is set to the low light amount Pb that corresponds to the APC-L. However, since the detection signal is amplified by the amplifier 403, the level of the amplified detection signal is sufficiently high that it can be used in the synchronous detection. The detection signal is held at the peak, and sampled in the A/D converter 412. If the level of the detection signal does not increase even when a predetermined time period has elapsed, the CPU 209 determines that the incidence of the laser beam on the light receiving section of the second light amount detection element 214 is entirely completed, and starts the APC-L. The CPU 209 will end the APC-L by the time the laser beam exits from the light receiving section. That is, the CPU 209 performs fine adjustment of the driving current until the light amount shown by the detection signal Sig2 matches the target light amount Pb. Thus, the CPU 209 serves as a light amount adjustment unit for obtaining a second driving current that flows through the laser light-emitting element when the second light amount reaches a second target light amount that is lower than the first target light amount.

Here, since the amplification factors G1 and G2 differ from each other, the level of the detection signal Sig2 for obtaining the light amount is also amplified. That is, the level of the detection signal Sig2 should be modified so as to indicate the actual light amount. Note that in the case where the light amount of the second light amount detection element 214 is used as a standard, the level of the detection signal Sig1 of the first light amount detection element 206 should be modified. In this way, it is necessary to modify a difference in scale between the detection signals Sig1 and Sig2 caused due to a difference between the amplification factors G1 and G2.

By way of example, the level of the detection signal Sig2 is modified, here. For example, if the magnification between the amplification factors G1 and G2 is three times, the CPU 209 modifies the level of the detection signal Sig2 to one third thereof. That is, the CPU 209 may modify the light amount shown by the detection signal Sig2, by dividing the light amount shown by the detection signal Sig2 by the magnification between the amplification factors G1 and G2 or by multiplying the light amount shown by the detection signal Sig2 by an inverse number of the magnification. Thus, the CPU 209 is an example of a modification unit that modifies the second light amount by dividing the second light amount (the light amount shown by the detection signal Sig2) by a predetermined modification coefficient (a magnification between the amplification factors G1 and G2) that corresponds to the amplification factor G1 of the first amplification unit and the amplification factor G2 of the second amplification unit. The adoption of the modification unit makes it possible to obtain the correct light amount even if the amplification factors G1 and G2 differ from each other.

According to the present embodiment, as illustrated in FIG. 3, the CPU 209 also calculates the threshold Th1 from two coordinates (I_Pa, Pa) and (I_Pb, Pb) that were defined by the APCs.

$$Th1 = I\_Pb - \{Pb \cdot (Pa-Pb)/(I\_Pa-I\_Pb)\}$$

Thus, the CPU 209 serves as a determination unit for determining a driving current serving as a threshold at which the laser light-emitting element starts to emit light, on the basis of the first target light amount, the first driving current, the second target light amount, and the second driving current.

As illustrated in FIG. 3, it is clear that the threshold Th1 of the present embodiment is closer to an ideal threshold Th than a threshold Th1', which is conventionally calculated from two coordinates (I_Pa, Pa) and (I_Pb', Pb'). Therefore, in Embodiment 1, it is possible to determine the threshold Th and the bias current of the laser light-emitting element 101 with high accuracy. This is because the target light amount Pb for the APC-L is lower than a target light amount Pb' in a general APC-L that uses the same amplification factors G1 and G2. Accordingly to the present embodiment, it is also possible to set a bias current value to an appropriate value even if the temperature of the laser light-emitting element 101 changes significantly. This makes it possible to reduce delay of turn on of the laser light-emitting element 101, resulting in stable image forming.

On the other hand, the detection signal indicating the light amount Pb is amplified, and the amplified detection signal is used as a synchronization signal. Particularly, in the present embodiment, since the amplification factor G2 is set to be higher than the amplification factor G1, the level of the detection signal that corresponds to the target light amount Pb can be amplified to a sufficient high level. Therefore, even if the light amount Pb for obtaining the threshold Th of the laser light-emitting element 101 is set lower, the synchronous detection can be performed. That is, although the target light amount Pb is lower than the general target light amount Pb', it is possible to realize the light amount detection and the synchronous detection.

Initializing Mode

As described above, one of the detection signals Sig1 and Sig2 is modified by the magnification between the amplification factors G1 and G2, so that if there is an error in the magnification between the amplification factors G1 and G2 (modification coefficient), this also incurs an error in the light amount. Now, an initializing mode for obtaining an actual magnification between the amplifiers 402 and 403 will be described, with reference to FIG. 6.

The CPU 209 sets the target light amount Pb for the APC-L in the light amount control section 211 and lets the laser light-emitting element 101 output the laser beam. As illustrated in FIG. 6, the laser beam 401 is incident on the first light amount detection element 206. A peak hold value X at this time is sampled in the A/D converter 412. While the target light amount Pb for the APC-L is being set in the light amount control section 211, the laser beam 401 is incident on the second light amount detection element 214. That is, laser beams having the same light amounts are incident on the first light amount detection element 206 and the second light amount detection element 214, respectively. A peak hold value Y is sampled by the A/D converter 412. The CPU 209 calculates, using these X and Y, a gain difference ΔG that is a difference in the actual amplification factors between the amplifiers 402 and 403.

$$\Delta G = Y/X$$

Thus, the CPU 209 serves as a magnification acquisition unit that acquires a magnification (gain difference ΔG) of the second light amount X for the second light amount detection unit with respect to the first light amount Y for the first light amount detection unit and, when the first light amount detection unit and the second light amount detection unit receive the laser beams having the same light amounts.

The CPU 209 modifies the level of the detection signal Sig1 or the detection signal Sig2 with the use of the gain difference ΔG, and determines the characteristic (I-L characteristic) of the light amount with respect to the driving current shown in FIG. 3. For example, when the I-L characteristic is plotted using the target light amount for the APC-H as a standard, the level of the detection signal Sig2 that corresponds to the APC-L is divided by ΔG. In contrast, when the I-L characteristic is plotted using the target light amount for the APC-L as a standard, the level of the detection signal Sig1 that corresponds to the APC-H is multiplied by ΔG. In this manner, by adopting the initializing mode for acquiring the magnification (gain difference ΔG) of the second light amount X with respect to the first light amount Y, it is possible to modify the light amount of the second light amount detection element 214 with high accuracy.

Embodiment 2

Figure 7A:
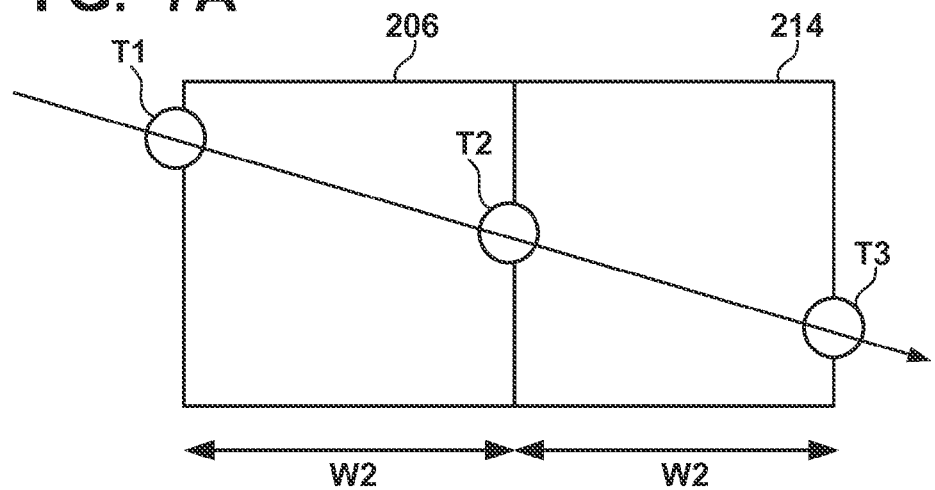
FIGS. 7A, 7B, 7C, and 7D are diagrams illustrating arrangement of the light amount detection elements, and relationships between a driving current and detection signals.

In Embodiment 1, the first light amount detection element 206 and the second light amount detection element 214 are arranged with a predetermined space therebetween. This is to secure a time for switching from the APC-H to the APC-L. In contrast, as illustrated in FIG. 7A, the first light amount detection element 206 and the second light amount detection element 214 may be arranged adjacent to each other. However, as illustrated in FIG. 7A, at time T2, the laser beam is detected by both the first light amount detection element 206 and the second light amount detection element 214. Therefore, some countermeasure is needed.

Figure 7B:
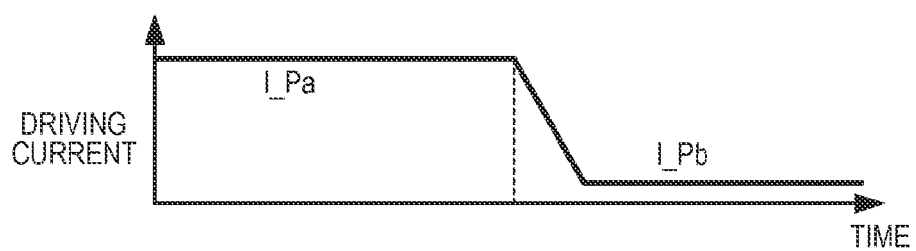
Figure 7C:
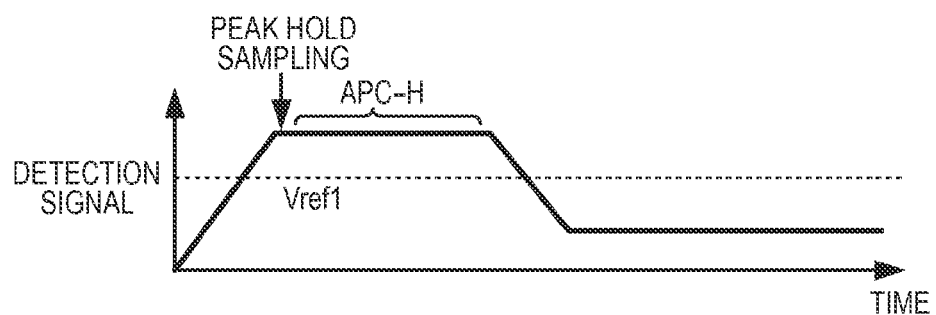

FIG. 7B illustrates a timing at which the driving current is changed when the shift from the APC-H to the APC-L occurs. FIG. 7C illustrates the level of the detection signal of the first light amount detection element 206, and FIG. 7D illustrates the level of the detection signal of the second light amount detection element 214.

The storage section 208 stores the I-L characteristic that was acquired in the previous APC. The CPU 209 calculates, from the I-L characteristic, the driving current I_Pa that corresponds to the light amount Pa for the APC-H, and sets it in the current control section 212 through the light amount control section 211. Accordingly, the current control section 212 drives the laser light-emitting element 101 with the driving current I_Pa. As illustrated in FIG. 7A, at time T1, the laser beam starts to be incident on the first light amount detection element 206. As illustrated in FIG. 7C, the level of the detection signal of the first light amount detection element 206 gradually increases. When the incidence of the laser beam on the light receiving section of the first light amount detection element 206 is entirely completed, the level of the detection signal reaches a peak. The CPU 209 starts the APC-H when a predetermined time period has elapsed since the level of the detection signal has exceeded the reference voltage Vref1. A time period in which the APC-H is implemented is set to be shorter than a time period from the time when the laser beam is incident on the first light amount detection element 206 to the time when the laser beam exits therefrom. When the laser beam starts to exit from the light receiving section of the first light amount detection element 206, the level of the detection signal of the first light amount detection element 206 starts to decrease. Accordingly, when the level of the detection signal decreases to a level equal to or less than the reference voltage Vref1, the level of the synchronization signal BD1 changes from Hi to Low. At time T2 at which the level of the synchronization signal BD1 has changed from Hi to Low, the CPU 209 sets the target light amount to Pb. The CPU 209 obtains, from the I-L characteristic obtained in the previous APC, the driving current I_Pb that corresponds to Pb, and sets the obtained driving current in the current control section 212 through the light amount control section 211.

Meanwhile, when the laser beam starts to be incident on the light receiving section of the second light amount detection element 214, the laser beam has not yet completely exited from the light receiving section of the first light amount detection element 206. That is, the laser beam will be incident on the light receiving section of the second light amount detection element 214, while the target light amount of the light amount control section 211 is being set to Pa. As illustrated in FIG. 7D, with the incidence of the laser beam, the level of the detection signal of the second light amount detection element 214 starts to increase. However, the amplification factor G2 of the amplifier 403 that amplifies the detection signal of the second light amount detection element 214 is several times higher than the amplification factor G1 that corresponds to the first light amount detection element 206. Therefore, the level of the detection signal that is output from the amplifier 403 may reach a design upper limit. In other words, it is impossible to start the APC-L by the time the laser beam completely exits the first light amount detection element 206, that is, by the time the target light amount is switched to Pb. Note that, in the above-described procedure, the target light amount will be switched from Pa to Pb by the time the laser beam completely exits the first light amount detection element 206.

Figure 7D:
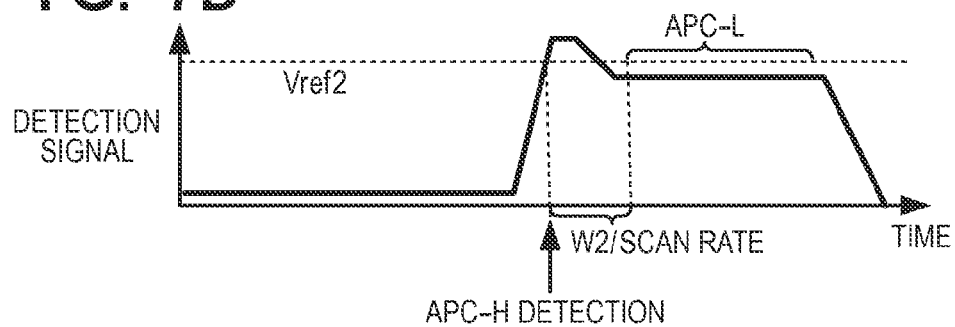

Therefore, as illustrated in FIG. 7D, the reference voltage Vref2 of the second binarization circuit 216 is set to a level between a peak level that corresponds to the target light amount Pb and the upper limit. When detecting that the level of the detection signal exceeds the reference voltage Vref2 (which is referred to as "APC-H detection"), the CPU 209 waits for a predetermined waiting time period. A length of the waiting time period is set to a value that is not less than a value calculated by dividing the spot diameter W1 of the laser beam by a scan rate of the laser beam. Therefore, the CPU 209 starts the APC-L at a timing at which the waiting time period has elapsed since the level of the detection signal has exceeded the reference voltage Vref2. Thus, the CPU 209 serves as a light amount adjustment unit that starts light amount adjustment processing for obtaining the second driving current at the timing at which a predetermined time period has elapsed since the level of the second detection signal that is output by the second light amount detection unit has exceeded a predetermined reference level. According to the present embodiment, by the APC-L being started at a timing at which a predetermined time period has elapsed, the first light amount detection element 206 and the second light amount detection element 214 can be arranged adjacent to each other. By allowing the first light amount detection element 206 and the second light amount detection element 214 to be arranged adjacent to each other, the light amount sensor 114 will be downsized. Also, by setting this time period to a value that is not less than a value calculated by dividing the spot diameter W1 of the laser beam by the scan rate of the laser beam, it is possible to start the APC-L at a more reliable timing.

As described above, in Embodiment 2, the first light amount detection element 206 and the second light amount detection element 214 can be arranged adjacent to each other, while achieving the similar effect as in Embodiment 1. Note that "adjacent to each other" refers to a situation in which the first light amount detection element 206 and the second light amount detection element 214 are arranged with a space narrower than the spot diameter W1 of the laser beam, therebetween. That is, "adjacent to each other" refers to a situation in which the first light amount detection element 206 and the second light amount detection element 214 are arranged so close to each other such that the laser beam is detected simultaneously by both elements.

Note that in Embodiments 1 and 2, two amplifiers are used. However, the amplifier 402 may be omitted if the level of the detection signal of the first light amount detection element 206 that corresponds to the light amount Pa is sufficiently high that it does not need to be amplified. In this case, the amplification factor G1 in the descriptions of Embodiments 1 and 2 may be read as "1".

In Embodiments 1 and 2, the amplification factor G1 of the first light amount detection element 206 is set to 10 times and the amplification factor G2 of the second light amount detection element 214 is set to 30 times, and the first light amount detection element 206 performs the APC-H and the second light amount detection element 214 performs the APC-L. However, it is also possible that the first light amount detection element 206 perform the APC-L and the second light amount detection element 214 perform the APC-H. In this case, however, the amplification factor G1 of the first light amount detection element 206 should be set to 30 times, and the amplification factor G2 of the second light amount detection element 214 should be set to 10 times. Such modifications are, of course, equivalent to Embodiments 1 and 2 on the equivalent theory.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-106310, filed May 7, 2012 which is hereby incorporated by reference herein in its entirety.

What is claimed is:

1. A laser drive apparatus for controlling a light amount of a laser beam scanned by a scanning unit, the laser drive apparatus comprising:
a first light amount detection unit configured to receive the laser beam that is output from a laser light-emitting element and to output a first detection signal that indicates a light amount of the laser beam;
a second light amount detection unit arranged side by side with the first light amount detection unit in a scanning direction of the laser beam, and configured to receive the laser beam output from the laser light-emitting element and to output a second detection signal that indicates the light amount of the laser beam;
an amplification unit configured to amplify the second detection signal that is output by the second light amount detection unit;
a binarization unit configured to binarize the second detection signal amplified by the amplification unit and to output the binarized second detection signal as a synchronization signal;
a modification unit configured to subject the second detection signal amplified by the amplification unit to analog/digital conversion, and to modify the converted second detection signal with a modification coefficient that corresponds to an amplification factor of the amplification unit;
a light amount adjustment unit configured to obtain a first driving current that flows through the laser light-emitting element when the light amount indicated by the first detection signal that is output by the first light amount detection unit reaches a first target light amount, and a second driving current that flows through the laser light-emitting element when the light amount indicated by the second detection signal that is output by the modification unit reaches a second target light amount that is lower than the first target light amount;
a determination unit configured to determine a driving current that serves as a threshold at which the laser light-emitting element starts to emit light, on the basis of the first target light amount, the first driving current, the second target light amount, and the second driving current.

2. The laser drive apparatus according to claim 1, further comprising:
a change unit configured to change a driving current of the laser light-emitting element from the driving current for obtaining the first target light amount to the driving current for obtaining the second target light amount, at a timing at which the scanned laser beam output from the laser light-emitting element moves from the first light amount detection unit to the second light amount detection unit.

3. The laser drive apparatus according to claim 2,
wherein the first light amount detection unit and the second light amount detection unit are arranged with a predetermined space therebetween, and
the change unit is configured to change the driving current of the laser light-emitting element from the driving current for obtaining the first target light amount to the driving current for obtaining the second target light amount, at a timing at which the light amount indicated by the first detection signal that is output by the first light amount detection unit changes, after having reached a peak, to a value that is less than a predetermined reference value, the timing being regarded as the timing at which the change unit moves from the first light amount detection unit to the second light amount detection unit.

4. The laser drive apparatus according to claim 2,
wherein the first light amount detection unit and the second light amount detection unit are arranged adjacent to each other, and
the change unit is configured to change the driving current of the laser light-emitting element from the driving current for obtaining the first target light amount to the driving current for obtaining the second target light amount, at a timing at which the light amount indicated by the first detection signal that is output by the first light amount detection unit changes, after having reached a peak, to a value that is less than a predetermined reference value, the timing being regarded as the timing at which the change unit moves from the first light amount detection unit to the second light amount detection unit.

5. The laser drive apparatus according to claim 4,
wherein the light amount adjustment unit is configured to start light amount adjustment processing for obtaining the second driving current at a timing at which a predetermined time period has elapsed since the level of the second detection signal that is output by the second light amount detection unit has exceeded a predetermined reference level.

6. The laser drive apparatus according to claim 5,
wherein a length of the predetermined time period is set to a value that is not less than a value obtained by dividing a spot diameter of the laser beam by a scan rate of the laser beam.

7. A laser drive apparatus for controlling a light amount of a laser beam scanned by a scanning unit, the laser drive apparatus comprising:
a first light amount detection unit configured to receive a laser beam that is output from a laser light-emitting element and to output a first detection signal that indicates a light amount of the laser beam;
a second light amount detection unit arranged side by side with the first light amount detection unit in a scanning direction of the laser beam, and configured to receive the laser beam output from the laser light-emitting element and to output a second detection signal that indicates the light amount of the laser beam;
a first amplification unit configured to amplify the first detection signal that is output by the first light amount detection unit;
a second amplification unit configured to amplify the second detection signal that is output by the second light amount detection unit;
a first binarization unit configured to binarize the first detection signal amplified by the first amplification unit and to output the binarized first detection signal as a synchronization signal;

a second binarization unit configured to binarize the second detection signal amplified by the amplification unit and to output the binarized second detection signal as a synchronization signal;

a first analog/digital conversion unit configured to subject the first detection signal amplified by the first amplification unit to analog/digital conversion, and to output a first light amount that corresponds to the first detection signal;

a second analog/digital conversion unit configured to subject the second detection signal amplified by the second amplification unit to the analog/digital conversion, and to output a second light amount that corresponds to the second detection signal;

a modification unit configured to modify the second light amount by dividing the second light amount by a predetermined modification coefficient that corresponds to an amplification factor of the first amplification unit and an amplification factor of the second amplification unit;

a light amount adjustment unit configured to obtain a first driving current that flows through the laser light-emitting element when the light amount indicated by the first detection signal that is output by the first light amount detection unit reaches a first target light amount, and a second driving current that flows through the laser light-emitting element when the light amount indicated by the second detection signal that is output by the modification unit reaches a second target light amount that is lower than the first target light amount;

a determination unit configured to determine a driving current that serves as a threshold at which the laser light-emitting element starts to emit light, on the basis of the first target light amount, the first driving current, the second target light amount, and the second driving current, wherein the amplification factor of the second amplification unit is higher than the amplification factor of the first amplification unit.

8. The laser drive apparatus according to claim 7, further comprising:

a magnification acquisition unit configured to acquire a magnification of the second light amount for the second light amount detection unit with respect to the first light amount for the first light amount detection unit, when the first light amount detection unit and the second light amount detection unit receive the laser beams having the same light amounts, wherein the modification unit is configured to divide the second light amount by using the magnification as the modification coefficient.

9. The laser drive apparatus according to claim 7, further comprising:

a change unit configured to change a driving current of the laser light-emitting element from the driving current for obtaining the first target light amount to the driving current for obtaining the second target light amount, at a timing at which the laser beam output from the laser light-emitting element moves from the first light amount detection unit to the second light amount detection unit.

10. The laser drive apparatus according to claim 9, wherein the first light amount detection unit and the second light amount detection unit are arranged with a predetermined space therebetween, and the change unit is configured to change the driving current of the laser light-emitting element from the driving current for obtaining the first target light amount to the driving current for obtaining the second target light amount, at a timing at which the light amount indicated by the first detection signal that is output by the first light amount detection unit changes, after having reached a peak, to a value that is less than a predetermined reference value, the timing being regarded as the timing at which the change unit moves from the first light amount detection unit to the second light amount detection unit.

11. The laser drive apparatus according to claim 9, wherein the first light amount detection unit and the second light amount detection unit are arranged adjacent to each other, and the change unit is configured to change the driving current of the laser light-emitting element from the driving current for obtaining the first target light amount to the driving current for obtaining the second target light amount, at a timing at which the light amount indicated by the first detection signal that is output by the first light amount detection unit changes, after having reached a peak, to a value that is less than a predetermined reference value, the timing being regarded as the timing at which the change unit moves from the first light amount detection unit to the second light amount detection unit.

12. The laser drive apparatus according to claim 11, wherein the light amount adjustment unit configured to start light amount adjustment processing for obtaining the second driving current, at a timing at which a predetermined time period has elapsed since the level of the second detection signal that is output by the second light amount detection unit has exceeded a predetermined reference level.

13. The laser drive apparatus according to claim 12, wherein a length of the predetermined time period is set to a value that is not less than a value obtained by dividing a spot diameter of the laser beam by a scan rate of the laser beam.

14. An image forming apparatus comprising:

a laser light-emitting element;

a laser drive apparatus configured to drive the laser light-emitting element;

a scanning unit configured to scan a laser beam that is output by the laser light-emitting element; and a photo conductor on which an electrostatic latent image is formed by the laser beam scanned by the scanning unit;

the laser drive apparatus comprising:

a first light amount detection unit configured to receive the laser beam that is output from a laser light-emitting element and to output a first detection signal that indicates a light amount of the laser beam;

a second light amount detection unit arranged side by side with the first light amount detection unit in a scanning direction of the laser beam, and configured to receive the laser beam output from the laser light-emitting element and to output a second detection signal that indicates the light amount of the laser beam;

an amplification unit configured to amplify the second detection signal that is output by the second light amount detection unit;

a binarization unit configured to binarize the second detection signal amplified by the amplification unit and to output the binarized second detection signal as a synchronization signal;

a modification unit configured to subject the second detection signal amplified by the amplification unit to analog/digital conversion, and to modify the converted second detection signal with a modification coefficient that corresponds to an amplification factor of the amplification unit;

a light amount adjustment unit configured to obtain a first driving current that flows through the laser light-emitting element when the light amount indicated by the first detection signal that is output by the first light amount detection unit reaches a first target light amount, and a second driving current that flows through the laser light-emitting element when the light amount indicated by the second detection signal that is output by the modification unit reaches a second target light amount that is lower than the first target light amount;

a determination unit configured to determine a driving current that serves as a threshold at which the laser light-emitting element starts to emit light, on the basis of the first target light amount, the first driving current, the second target light amount, and the second driving current.

15. An image forming apparatus comprising:

a laser light-emitting element;

a laser drive apparatus configured to drive the laser light-emitting element;

a scanning unit configured to scan a laser beam that is output by the laser light-emitting element; and a photo conductor on which an electrostatic latent image is formed by the laser beam scanned by the scanning unit;

the laser drive apparatus comprising:

a first light amount detection unit configured to receive the laser beam that is output from a laser light-emitting element and to output a first detection signal that indicates a light amount of the laser beam;

a second light amount detection unit arranged side by side with the first light amount detection unit in a scanning direction of the laser beam, and configured to receive the laser beam output from the laser light-emitting element and to output a second detection signal that indicates the light amount of the laser beam;

a first amplification unit configured to amplify the first detection signal that is output by the first light amount detection unit;

a second amplification unit configured to amplify the second detection signal that is output by the second light amount detection unit;

a first binarization unit configured to binarize the first detection signal amplified by the first amplification unit and to output the binarized first detection signal as a synchronization signal;

a second binarization unit configured to binarize the second detection signal amplified by the amplification unit and to output the binarized second detection signal as a synchronization signal;

a first analog/digital conversion unit configured to subject the first detection signal amplified by the first amplification unit to analog/digital conversion, and to output a first light amount that corresponds to the first detection signal;

a second analog/digital conversion unit configured to subject the second detection signal amplified by the second amplification unit to the analog/digital conversion, and to output a second light amount that corresponds to the second detection signal;

a modification unit configured to modify the second light amount by dividing the second light amount by a predetermined modification coefficient that corresponds to an amplification factor of the first amplification unit and an amplification factor of the second amplification unit;

a light amount adjustment unit configured to obtain a first driving current that flows through the laser light-emitting element when the light amount indicated by the first detection signal that is output by the first light amount detection unit reaches a first target light amount, and a second driving current that flows through the laser light-emitting element when the light amount indicated by the second detection signal that is output by the modification unit reaches a second target light amount that is lower than the first target light amount;

a determination unit configured to determine a driving current that serves as a threshold at which the laser light-emitting element starts to emit light, on the basis of the first target light amount, the first driving current, the second target light amount, and the second driving current, wherein the amplification factor of the second amplification unit is higher than the amplification factor of the first amplification unit.

* * * * *